(12) United States Patent
Likhanskii (10) Patent No.: US 10,068,758 B2
(45) Date of Patent: Sep. 4, 2018

(54) ION MASS SEPARATION USING RF EXTRACTION

(71) Applicant: Varian Semiconductor Equipment Associates, Inc., Gloucester, MA (US)

(72) Inventor: Alexandre Likhanskii, Malden, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 70 days.

(21) Appl. No.: 15/417,767

(22) Filed: Jan. 27, 2017

(65) Prior Publication Data

US 2018/0218894 A1   Aug. 2, 2018

(51) Int. Cl.
*G21K 5/04*   (2006.01)
*H01J 49/22*   (2006.01)
*H01J 49/06*   (2006.01)

(52) U.S. Cl.
CPC ............ *H01J 49/22* (2013.01); *H01J 49/061* (2013.01)

(58) Field of Classification Search
CPC ........ H01J 49/22; H01J 49/061; H01J 27/024; H01J 27/04; H01J 2229/482; G21K 5/00; G21K 5/02; G21K 5/04
USPC ............ 250/396 R, 397, 492.1, 492.2, 492.3
See application file for complete search history.

(56) References Cited

U.S. PATENT DOCUMENTS

| | | | | |
|---|---|---|---|---|
| 4,929,839 | A | * | 5/1990 | Parker ................. H01J 37/3007 250/398 |
| 5,189,303 | A | * | 2/1993 | Tanjyo ................. H01J 27/024 250/296 |
| 7,888,653 | B2 | | 2/2011 | Kellerman et al. |
| 2004/0031933 | A1 | | 2/2004 | Li |
| 2008/0029696 | A1 | | 2/2008 | Li |
| 2009/0114838 | A1 | * | 5/2009 | Lozano ..................... H01J 3/04 250/396 R |
| 2013/0256566 | A1 | | 10/2013 | Kariya et al. |
| 2014/0265849 | A1 | | 9/2014 | Biloiu et al. |
| 2015/0014275 | A1 | * | 1/2015 | Barnard ................. H01J 37/08 216/66 |
| 2015/0279612 | A1 | | 10/2015 | Yagita |

OTHER PUBLICATIONS

International Search Report and Written Opinion dated Feb. 22, 2018 in corresponding PCT application No. PCT/US2017/061918.
Costel, Biloiu, et al., Radio Frequency Extraction, filed as U.S. Appl. No. 15/133,261 dated Apr. 20, 2016.

* cited by examiner

*Primary Examiner* — Nicole Ippolito
(74) *Attorney, Agent, or Firm* — Nields, Lemack & Frame, LLC (57) ABSTRACT

An apparatus which has the capability of filtering unwanted species from an extracted ion beam without the use of a mass analyzer magnet is disclosed. The apparatus includes an ion source having chamber walls that are biased by an RF voltage. The use of RF extraction causes ions to exit the ion source at different energies, where the energy of each ion species is related to its mass. The extracted ion beam can then be filtered using only electrostatic energy filters to eliminate the unwanted species. The electrostatic energy filter may act as a high pass filter, allowing ions having an energy above a certain threshold to reach the workpiece. Alternatively, the electrostatic energy filter may act as a low pass filter, allowing ions having an energy below a certain threshold to reach the workpiece. In another embodiment, the electrostatic energy filter operates as a bandpass filter.

17 Claims, 5 Drawing Sheets

ION MASS SEPARATION USING RF EXTRACTION

FIELD

Embodiments relate to an apparatus for performing mass separation, and more particularly, an ion source having RF extraction and an electrostatic energy filter disposed downstream from the ion source.

BACKGROUND

Ions are used in a plurality of semiconductor processes, such as implantation, amorphization, deposition and etching processes. These ions may be created within an ion source chamber and extracted through an extraction aperture in the ion source chamber.

There are several different types of ion implantation systems. A first type is referred to as a beam-line system. In a beam-line system, ions are extracted from an ion source, pass through a mass analyzer to select particular ions based on their mass to charge ratio, and are made into a parallel ribbon ion beam. Beam-line systems may also include deceleration stages, and other components to make the resulting ribbon ion beam more uniform.

A second type of ion implantation system is referred to as a plasma immersion ion implantation system. In these systems, the workpiece is disposed within the plasma chamber. Ions from the plasma are attracted toward the workpiece by negatively biasing the workpiece relative to the plasma.

A third type of ion implantation system uses a plasma chamber to create a plasma. Ions from that plasma are extracted through an extraction aperture and accelerated directly toward a workpiece, which is disposed outside the plasma chamber.

Each type of ion implantation has advantages and shortcomings. For example, the third type of system is relatively low cost and generates ion beams having high current, but lacks the capability to filter out unwanted species. It would be beneficial if there were an apparatus that retains the advantages of this third type of system, but was also able to filter unwanted species from the extracted ribbon ion beam.

SUMMARY

An apparatus which has the capability of filtering unwanted species from an extracted ion beam without the use of a mass analyzer magnet is disclosed. The apparatus includes an ion source having chamber walls that are biased by an RF voltage. Disposed outside the extraction aperture of the ion source are extraction optics, which may be grounded or DC biased. The use of RF extraction causes ions to exit the ion source at different energies, where the energy of each ion species is related to its mass. The extracted ion beam can then be filtered using only electrostatic energy filters to eliminate the unwanted species. The electrostatic energy filter may act as a high pass filter, allowing ions having an energy above a certain threshold to reach the workpiece. Alternatively, the electrostatic energy filter may act as a low pass filter, allowing ions having an energy below a certain threshold to reach the workpiece. In another embodiment, the electrostatic energy filter operates as a bandpass filter.

According to one embodiment, an apparatus for extracting an ion beam is disclosed. The apparatus comprises an ion source having a plurality of chamber walls defining an ion source chamber, wherein one of the chamber walls comprises an extraction plate having an extraction aperture, wherein the extraction plate is biased using an RF voltage; extraction optics, disposed outside the ion source chamber, to extract an ion beam from the ion source chamber through the extraction aperture; and an electrostatic energy filter disposed downstream from the extraction optics to selectively allow certain ions from the ion beam to reach a workpiece. In certain embodiments, the extraction optics are DC biased. In certain embodiments, the electrostatic energy filter uses only electric fields to manipulate the ion beam. In some embodiments, the electrostatic energy filter functions as a high pass filter, passing ions having an energy greater than a first predetermined value. In other embodiments, the electrostatic energy filter functions as a low pass filter, passing ions having an energy less than a second predetermined value. In yet other embodiments, the electrostatic energy filter functions as a band pass filter, passing ions having an energy between a first predetermined value and a second predetermined value. In certain embodiments, the apparatus comprises a second electrostatic energy filter disposed between the electrostatic energy filter and the workpiece.

According to another embodiment, an apparatus for extracting an ion beam is disclosed. The apparatus comprises an ion source having a plurality of chamber walls defining an ion source chamber, wherein one of the chamber walls comprises an extraction plate having an extraction aperture, wherein the extraction plate is biased using an RF voltage; extraction optics, disposed outside the ion source chamber, to extract an ion beam from the ion source chamber through the extraction aperture; and an electrostatic energy filter disposed downstream from the extraction optics, wherein the electrostatic energy filter comprises at least one electrode comprising an aperture therethrough, to selectively allow ions from the ion beam having a certain energy to pass through the aperture and to reach a workpiece. In certain embodiments, the electrostatic energy filter comprises a first electrode biased at a first positive voltage, such that ions having an energy less than the first positive voltage are repelled by the first electrode, so that ions having an energy greater than the first positive voltage pass through the aperture. In a further embodiment, the apparatus further comprises a second electrode biased at a negative voltage disposed between the first electrode and the workpiece to accelerate ions passing through the aperture of the first electrode. In certain embodiments, the electrostatic energy filter comprises an entry electrode, an exit electrode and at least one central electrode, each electrode comprising an upper plate and a lower plate, defining an aperture therebetween, where the upper plate and lower plate are independently biased, and wherein apertures of the electrodes are not linearly aligned. In certain embodiments, the electrostatic energy filter comprises a plurality of central electrodes. In certain embodiments, the electrostatic energy filter comprises an entry electrode, an exit electrode and at least one central electrode, each electrode comprising two independently biased spaced apart conductive rods, defining an aperture therebetween, wherein apertures of each electrode are not linearly aligned.

According to another embodiment, an apparatus for extracting an ion beam is disclosed. The apparatus comprises an ion source configured to extract an ion beam, wherein each species of ions in the ion beam has a unique ion energy distribution function; and an electrostatic energy filter, disposed downstream from the ion source, to selectively pass certain species of ions toward a workpiece, based on the unique ion energy distribution function. In certain embodiments, the electrostatic energy filter comprises a resolving aperture, such that only ions having a desired energy pass through the resolving aperture and are directed toward the workpiece. In some embodiments, the apparatus comprises a second electrostatic energy filter, disposed between the electrostatic energy filter and the workpiece, to selectively pass certain species of ions toward the workpiece, based on the unique ion energy distribution function.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
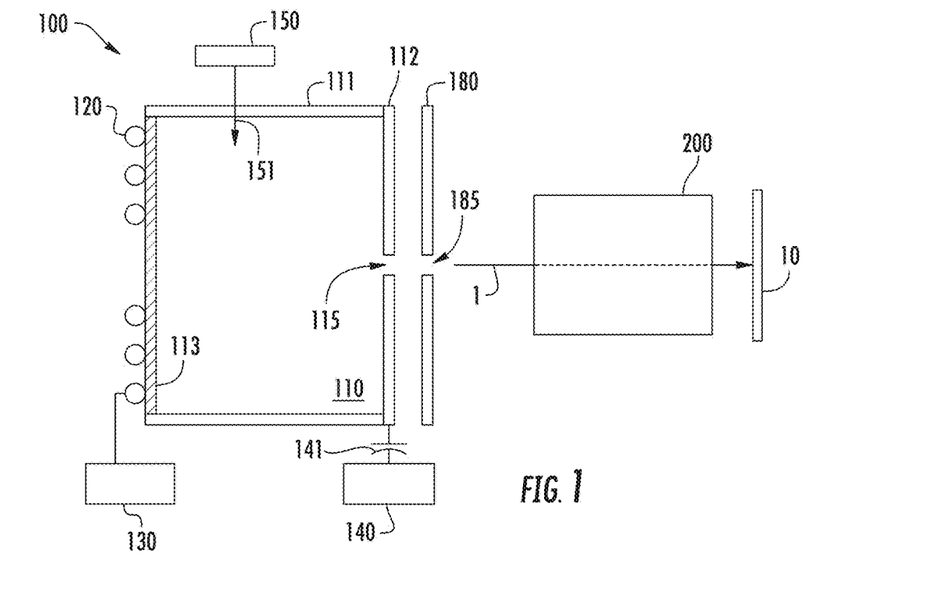
FIG. 1 shows an apparatus for separating ions according to mass using an electrostatic energy filter according to one embodiment.

FIG. 1 shows a first embodiment of an apparatus that may be used to separate ions according to mass using only electrostatic energy filters. The apparatus includes an ion source 100. The ion source 100 comprises a plurality of chamber walls 111 defining an ion source chamber 110. An RF antenna 120 may be disposed against a dielectric window 113. This dielectric window 113 may comprise part or all of one of the chamber walls 111. The RF antenna 120 may comprise an electrically conductive material, such as copper. An RF power supply 130 is in electrical communication with the RF antenna 120. The RF power supply 130 may supply an RF voltage to the RF antenna 120. The power supplied by the RF power supply 130 may be between 0.1 and 10 kW and may be any suitable frequency, such as between 1 and 15 MHz. Further, the power supplied by the RF power supply 130 may be pulsed.

While the figures show the RF antenna 120 disposed against a dielectric window outside the ion source chamber 110, other embodiments are also possible. For example, the plasma may be generated in a different manner, such as by a Bernas ion source, a capacitively coupled plasma (CCP) source, an indirectly heated cathode (IHC or another plasma source). The manner in which the plasma is generated is not limited by this disclosure.

In certain embodiments, the chamber walls 111 may be electrically conductive, and may be constructed of metal. In certain embodiments, these chamber walls 111 may be electrically biased by bias power supply 140. The bias voltage applied to the chamber walls 111 establishes the potential of the plasma within the ion source chamber 110. The difference between the electrical potential of the plasma and the electrical potential of the ground electrode 180 may help determine the energy that the extracted ions possess.

One chamber wall, referred to as the extraction plate 112, includes an extraction aperture 115. The extraction aperture 115 may be an opening through which the ions generated in the ion source chamber 110 are extracted and directed toward a workpiece 10. The extraction aperture 115 may be any suitable shape. In certain embodiments, the extraction aperture 115 may be oval or rectangular shaped, having one dimension, referred to as the length, which may be much larger than the second dimension, referred to as the height. In certain embodiments, the length of the extraction aperture 115 may be as large as two meters or more. As described above, in certain embodiments, all of the chamber walls 111 and the extraction plate 112 are electrically conductive. In other embodiments, only the extraction plate 112 is electrically conductive and in communication with the bias power supply 140. The remaining chamber walls 111 may be made of a dielectric material. The bias power supply 140 may bias the chamber walls 111 and the extraction plate 112 at a RF voltage of between 0.5 kV and 10 kV, and a frequency of between 0.1 and 50 MHz.

Disposed outside and proximate the extraction aperture 115 are extraction optics. In certain embodiments, the extraction optics comprises a ground electrode 180. The ground electrode 180 may be a single electrically conductive component with a ground aperture 185 disposed therein. Alternatively, the ground electrode 180 may be comprised of two electrically conductive components that are spaced apart so as to create the ground aperture 185 between the two components. The ground electrode 180 may be a metal, such as titanium. The ground electrode 180 may be electrically connected to ground. Of course, in other embodiments, the ground electrode 180 may be biased using a separate power supply. The extraction aperture 115 and the ground aperture 185 are aligned.

In other embodiments, the extraction optics may be more complex. For example, the extraction optics may include one or more additional electrodes. For example, there may be one or more electrodes that are disposed between the extraction plate 112 and the ground electrode 180. In other embodiments, there may be one or more electrode disposed between the ground electrode 180 and the electrostatic energy filter 200. The configuration of the extraction optics may vary and is not limited by this disclosure.

Located downstream from the ground electrode 180 is an electrostatic energy filter 200. The electrostatic energy filter 200, unlike traditional mass analyzers, utilizes only electrical fields to filter the ion beam 1 based on mass. More particularly, the electrostatic energy filter 200 uses electrical fields to manipulate the energy of the ion beam 1. The energies of the ions that are extracted from the ion source 100 are related to their mass. Thus, the electrostatic energy filter 200 has the effect of filtering the ion beam based on the mass of the ions. Since the mass of each species is different, the electrostatic energy filter 200 has the effect of filtering based on the type of species. Further, as described above, this filtering is performed without the use of magnets or magnetic fields.

In operation, feed gas from a gas storage container 150 is introduced to the ion source chamber 110 through a gas inlet 151. The RF antenna 120 is energized by the RF power supply 130. This energy excites the feed gas, causing the creation of a plasma. Ions in that plasma are typically positively charged. Because the ground electrode 180 is more negatively biased than the chamber walls 111 and the extraction plate 112, the ions exit the extraction aperture 115 in the form of an ion beam 1. The ion beam 1 passes through the extraction aperture 115, the ground aperture 185, the electrostatic energy filter 200 and travels toward the workpiece 10.

As described above, the bias power supply 140 supplies an RF voltage to the chamber walls 111 through a blocking capacitor 141. The RF voltage output from the bias power supply 140 may be in the form: $V_{bias} = V_0 \sin(2\pi f)$, where $V_0$ is the amplitude of the bias voltage and f is the frequency of the bias voltage.

Once enabled, the ion source will develop an average positive potential, referred to as the self-bias voltage. This self-bias voltage is typically a positive value. Thus, the voltage of the plasma can be expressed as: $V_{plasma} = V_{selfbias} + V_0 \sin(2\pi f)$, where $V_{selfbias}$ is the self-bias voltage, $V_0$ is the amplitude of the bias voltage and f is the frequency of the bias voltage.

Ions are attracted toward the ground electrode 180 whenever the electrical potential of the plasma is positive relative to the ground electrode 180. If $V_{selfbias}$ is greater than or equal to $V_0$, the plasma will always be more positive than the ground electrode 180. If $V_{selfbias}$ is less than $V_0$, the plasma will be more positive than the ground electrode 180 whenever $\sin(2\pi f)$ is greater than $-V_{selfbias}/V_0$. The self-bias voltage may be a function of $V_0$, the size of the ground electrode 180, the size of the extraction plate 112, and the frequency of the bias voltage.

However, since the ions have a finite mass and inertia, the ions cannot react instantaneously to the changing plasma potential. For example, heavy ions cannot respond to the high frequency changes in the RF voltage. As a result, these heavy ions are all extracted with an energy that is roughly equal to the self-bias voltage. Lighter ions have less inertia and therefore have an ability to react to the changing plasma potential. Thus, lighter ions are extracted at different energies than heavier ions.

Figure 2:
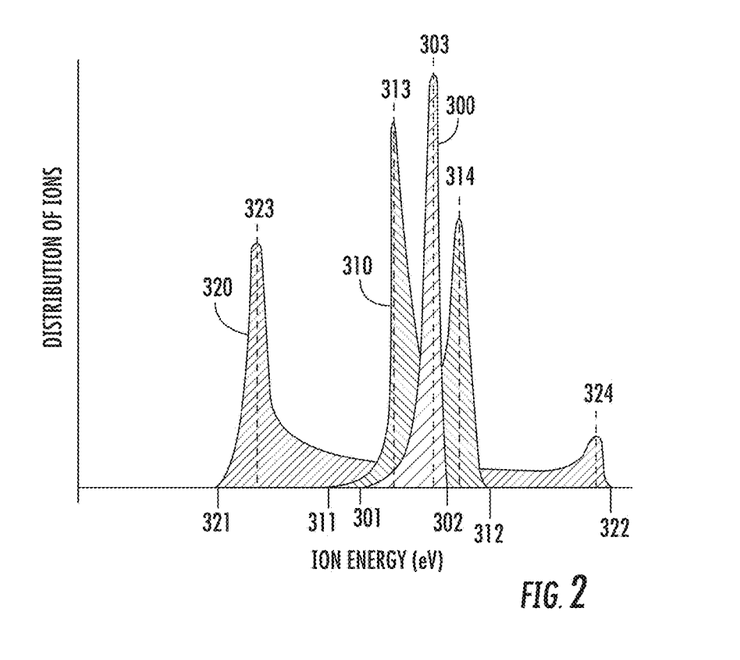
FIG. 2 shows a graph that represents the energy of the ions as a function of mass for three different species.

Stated differently, different ions have different ion energy distribution functions. For example, FIG. 2 shows the ion energy distribution for various species being extracted from an ion source which utilizes an RF voltage having a frequency of 13.56 MHz. Line 300 shows the ion energy distribution function for a heavy species of ions. Note that nearly all of these ions have the same energy, as the ion energy distribution function of the heavy species is one very narrow peak 303. The energy level of these heavy species at this narrow peak 303 may be very close to the self-bias voltage of the plasma, as described above. Further, the distribution of the heavy species is very narrow, extending between line 301 and line 302.

Line 320 shows the ion energy distribution function for a very light species of ion. Note that the light species are extracted at a much broader range of energy levels, extending from line 321 to line 322. However, there is one large peak 323 that occurs at an energy much lower than the self-bias voltage, and one smaller peak 324 at an energy much greater than the self-bias voltage.

Line 310 shows the ion energy distribution function of a species having a mass between the heavy species and the light species. Like the light species, line 310 has a dual peak profile, where each of those peaks are closer to the self-bias voltage than the peaks for the light species. Specifically, the peak 313 is at a higher energy than peak 323, while peak 314 is at a lower energy than peak 324. Further, the amplitude of these two peaks 313, 314 are somewhat greater than the amplitudes of the peaks 323, 324 of the light species. This may be because all of the medium mass ions are extracted over a narrower range of energies. The range of energies for the medium mass species is between line 311 and line 312.

Based on this graph, it can be seen that the ion energy distribution is tighter (i.e. span a smaller range of energies) for heavier species. Lighter species have a much wider distribution of energies. Thus, the use of an extraction voltage that includes an RF component results in an ion beam 1 that has multiple species, where each of those species has a particular ion energy distribution function that is related to its mass.

The fact that the extracted ions in the ion beam 1 have a unique ion energy distribution function may be exploited to filter unwanted species from the extracted ion beam.

An electrostatic energy filter 200 may be used to select one or more of these extracted species. The complexity of the electrostatic energy filter 200 may be varied, based on the desired species. For example, referring to FIG. 2, if it is desired to have an ion beam that comprises only the light species, the electrostatic energy filter 200 may be used to only allow ions having an energy greater than that represented by line 312 to pass to the workpiece 10. Alternatively, the electrostatic energy filter 200 may be used to only allow ions having an energy less than that represented by line 311 to pass to the workpiece 10.

Figure 3A:
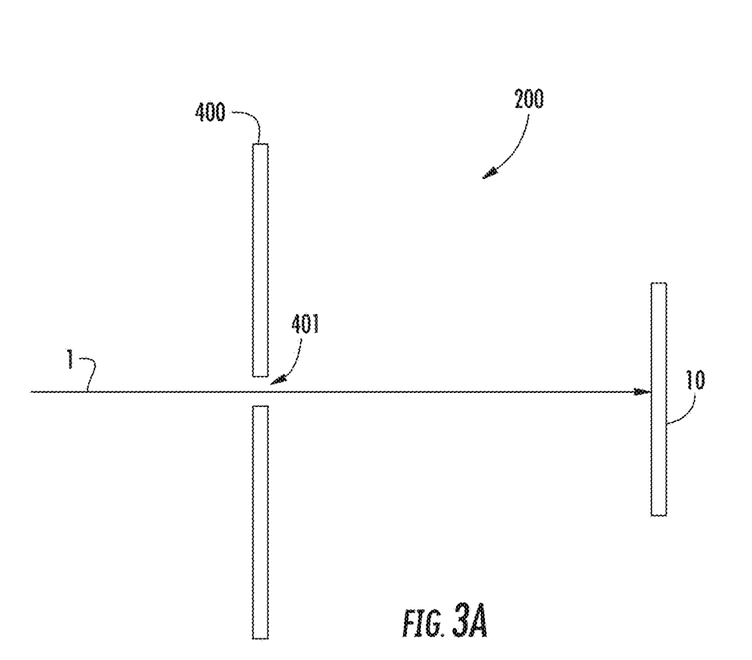
FIGS. 3A and 3B show two embodiments of an electrostatic energy filter.

In one embodiment, shown in FIG. 3A, the electrostatic energy filter 200 may comprise a single conductive plate 400, having an aperture 401, that is biased at a predetermined voltage, such as a voltage that is slightly greater that that represented by line 312. All ions that are extracted with an energy level less than this predetermined voltage will be repelled by the conductive plate 400, and will not pass through the electrostatic energy filter 200. Ions having an energy greater than the predetermined voltage will pass through the aperture 401 and travel toward the workpiece 10.

Thus, in one embodiment, the electrostatic energy filter 200 may be one conductive plate that are biased at a predetermined voltage to form a high pass filter so as only to pass the lightest species.

Figure 3B:
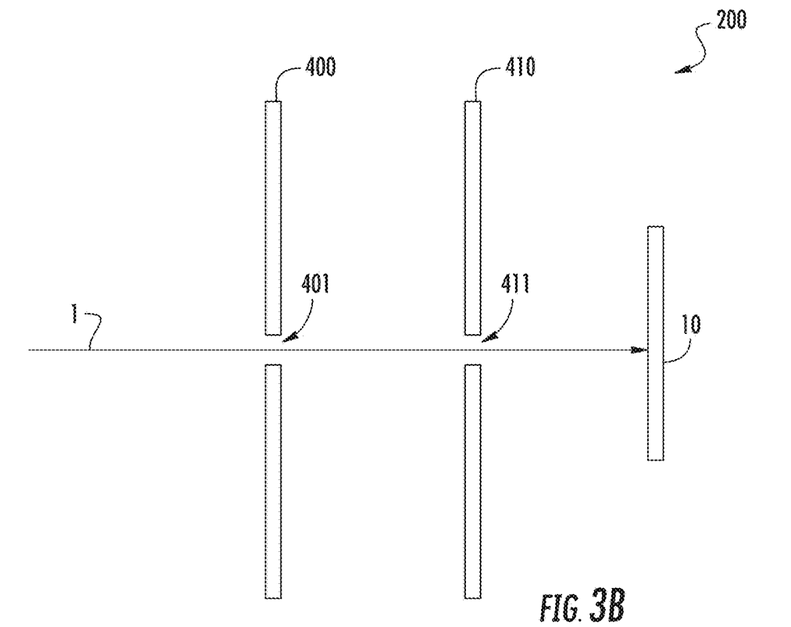

Of course, the electrostatic energy filter 200 may comprise a plurality of conductive plates. For example, FIG. 3B shows an electrostatic energy filter 200 having a conductive plate 400 with an aperture 401, that is positively biased at a first predetermined voltage to repel ions having an ion energy less than the first predetermined voltage. A second conductive plate 410, having an aperture 411, may be disposed downstream from the conductive plate 400. This second conductive plate 410 may be negatively biased so as to accelerate the ions that pass through the aperture 401. In this particular embodiment, the apertures 401, 411 may be aligned so that the ions travel in a straight path.

Figure 4A:
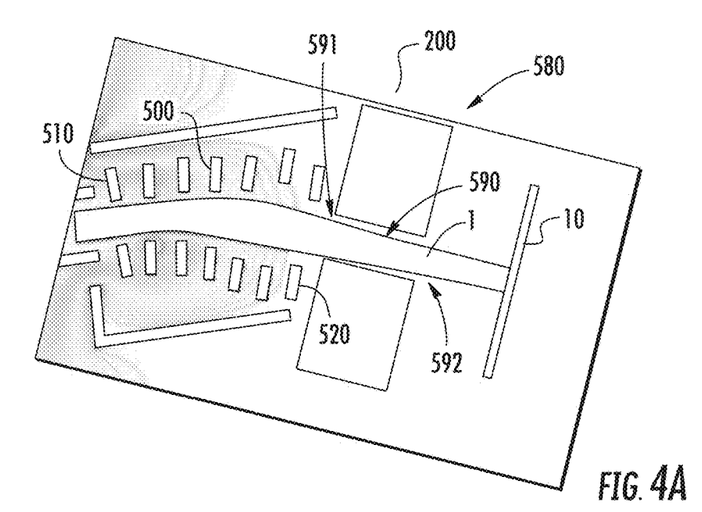
FIGS. 4A and 4B show other embodiments of an electrostatic energy filter.

While FIGS. 3A and 3B show an embodiment where the electrostatic energy filter 200 behaves as a high pass filter, other configurations are also possible. FIG. 4A shows one such configuration. In this configuration, the electrostatic energy filter 200 includes an entry electrode 510, an exit electrode 520, and one or more central electrodes 500 disposed between the entry electrode 510 and the exit electrode 520. Each electrode is a conductive material, such as a conductive plate. Further, each electrode comprises an aperture. Each electrode comprises two spaced apart conductive plates, where the space between the two plates forms the aperture. These spaced apart plates may be referred to as the upper plate and the lower plate of the electrode. The upper plate and the lower plate of each electrode may be independently biased at different voltages to cause the ions to be deflected. Further, each central electrode 500 may be biased independently of every other central electrode 500. The apertures of the electrodes are not linearly aligned. In the way, the ion beam is deflected as it passes through the electrostatic energy filter 200.

In certain embodiments, disposed downstream from the exit electrode 520 is a plasma flood gun region 580. The plasma flood gun region 580 comprises a tunnel 590 into which electrons are targeted. The tunnel 590 also has an entrance aperture 591 and an exit aperture 592. The entrance aperture 591 may also function as a resolving aperture, as described in more detail below.

As seen in FIG. 4A, the path of the ion beam 1 is not linear. In fact, the bias applied to each of the upper and lower plates of the central electrodes 500 creates electric fields that cause the ion beam 1 to be deflected as it passes through apertures in each of the central electrodes 500. If all of the ions had the same energy, the electrical fields in the electrostatic energy filter 200 would cause all of the ions to follow the path of the ion beam 1 shown in FIG. 4A. In other words, the electrical fields cause the ions to deflect downward. However, as described above, with respect to FIG. 2, the ions that are extracted from the ion source 100 have different energies.

Figure 4B:
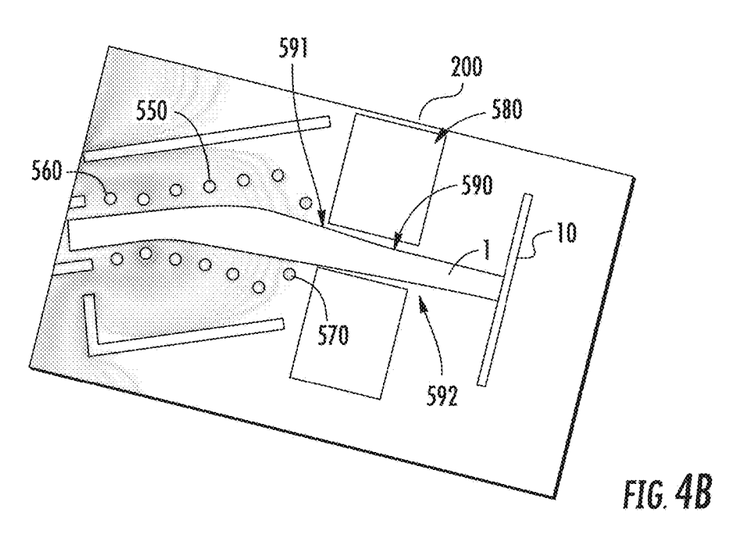

FIG. 4B shows another embodiment of the electrostatic energy filter 200. In this embodiment, the conductive plates that make up each electrode are replaced by conductive rods. Thus, the electrostatic energy filter 200 is still made up of an entry electrode 560, an exit electrode 570 and one or more central electrodes 550. However, each of these electrodes is made up of two spaced apart conductive rods, having an aperture therebetween. Each of the spaced apart conductive rods may be independently biased. The operation of this embodiment is the same as that described with respect to FIG. 4A.

Figure 5A:
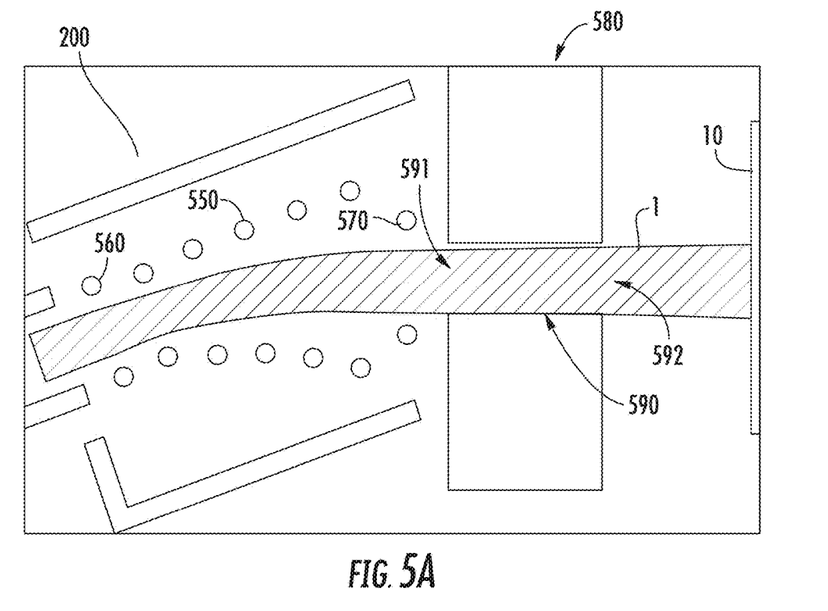
FIGS. 5A-5C show the path of ions of various energies through the electrostatic energy filters of FIGS. 4A-4B.
Figure 5B:
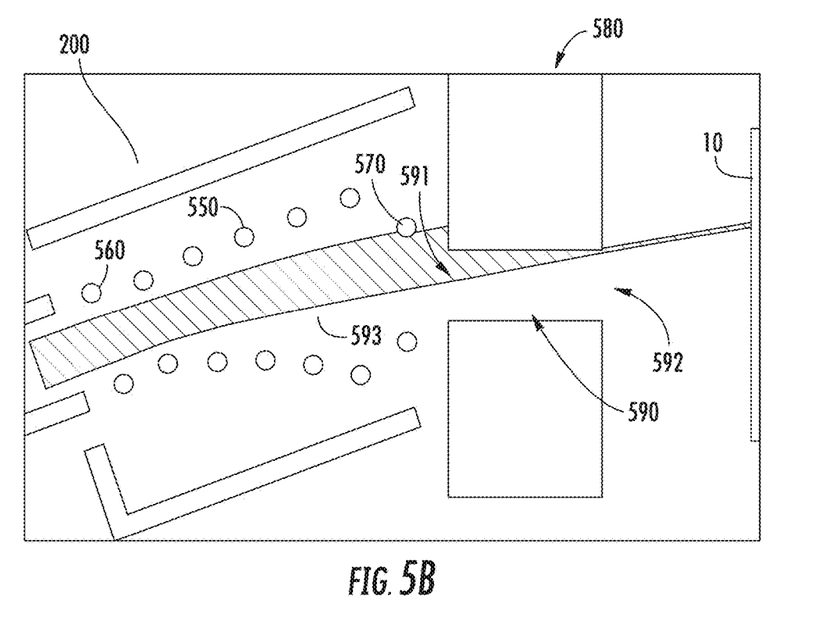
Figure 5C:
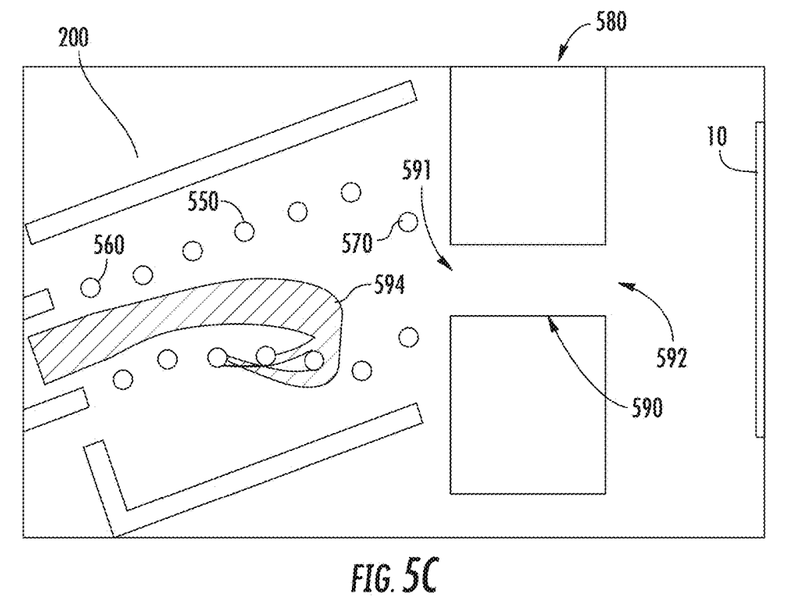

The electrical fields in the electrostatic energy filter 200 cause these ions to follow different paths. FIGS. 5A-5C show three different scenarios using the electrostatic energy filter 200 of FIG. 4B. For example, ions having the desired energy may follow the path of ion beam 1. This is shown in FIG. 5A. The ions pass through the electrostatic energy filter 200, and through the entrance aperture 591. The ions exit the tunnel 590 and travel toward the workpiece 10.

Ions having greater than the desired energy may not be deflected downward to the same extent. Thus, ions with too much energy may not pass through the entrance aperture 591. FIG. 5B shows the projected path 593 of ions that have greater energy than desired. Note that the projected path 593 of these ions is deflected to a lesser extent than those in FIG. 5A. Consequently, the ions are not deflected sufficiently so as to pass through the entrance aperture 591. Thus, the entrance aperture 591 functions as a resolving aperture, permitting only ions with a prescribed energy to pass.

Similarly, ions having less than the desired energy may be deflected to a greater extent than desired. These ions with too little energy may strike the lower part of one of the central electrodes 550, or may not pass through the entrance aperture 591. FIG. 5C shows the projected path 594 of ions that have less energy than desired. In this figure, the ions are pulled back toward one of the central electrodes 550.

Thus, FIGS. 5A-5C show that only ions of the desired energy pass through the electrostatic energy filter 200 and reach the workpiece 10.

Figure 6:
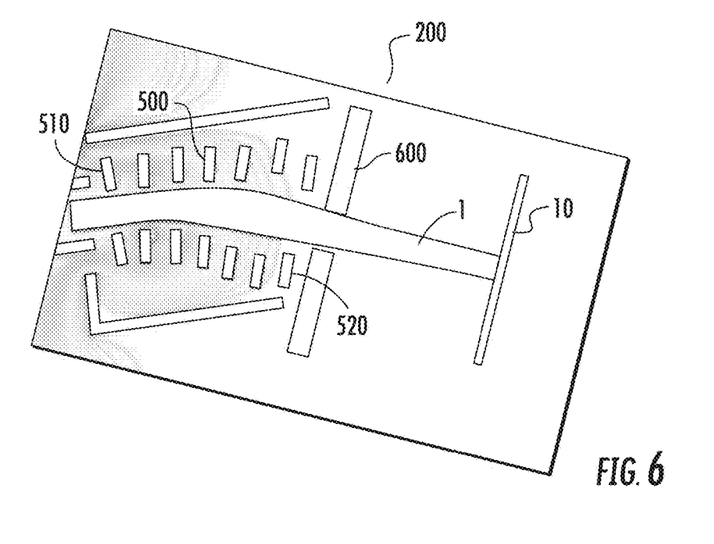
FIG. 6 shows the electrostatic energy filter of FIG. 4A using a resolving aperture.

While FIGS. 4A-4B and 5A-5C show a plasma flood gun region 580 disposed after the electrostatic energy filter 200, there are other embodiments. For example, a resolving aperture 600 may be disposed after the electrostatic energy filter 200, as shown in FIG. 6. This resolving aperture 600 may have the effect of stopping ions having an energy different than the desired energy level. In other words, the resolving aperture 600 may perform the same function as the tunnel 590 in the plasma flood gun region 580. While FIG. 6 shows the embodiment of FIG. 4A with a resolving aperture 600, the resolving aperture may also be used with the embodiment of FIG. 4B.

Further, these various embodiments can be combined. For example, the high pass filter of FIG. 3A may be used in conjunction with the electrostatic energy filter 200 of FIG. 4A or 4B. Further, the electrostatic energy filter 200 of FIG. 4A or 4B may be cascaded, where each filter is designed to pass a particular band of energies.

In operation, the frequency and amplitude of the bias voltage may be selected to provide optimum ion energy distribution functions and ion beam quality, taking into account subsequent filtering. For example, the frequency may be selected to create a desired energy gap between the peak of interest and the other peaks (see FIG. 2). In certain embodiments, the bias power supply 140 may be a variable power supply so that the frequency may be modified based on the desired species. As described above, the spacing between peaks may be dependent on the frequency of the bias voltage.

Further, while this disclosure describes a sinusoidal bias voltage, other embodiments are also possible. For example, the bias voltage may be a sawtooth shape. In certain embodiment, the bias voltage comprises a multifrequency RF signal.

The present apparatus has many advantages. First, by utilizing a modulated bias voltage, it is possible to separate an ion beam by mass without the use of expensive magnets. Further, the size of the system is much reduced by the use of a modulated bias voltage with an electrostatic energy filter. Additionally, in some embodiments, the electrostatic energy filter may simply be a biased conductive plate, further reducing the cost and size of the apparatus. Further, tuning of the electrostatic energy filter may be more straightforward.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus for extracting an ion beam, comprising:
    an ion source having a plurality of chamber walls defining an ion source chamber, wherein one of the chamber walls comprises an extraction plate having an extraction aperture, wherein the extraction plate is biased using an RF voltage;
    extraction optics, disposed outside the ion source chamber, to extract an ion beam from the ion source chamber through the extraction aperture; and
    an electrostatic energy filter disposed downstream from the extraction optics to selectively allow certain ions from the ion beam to reach a workpiece.

2. The apparatus of claim 1, wherein the extraction optics are DC biased.

3. The apparatus of claim 1, wherein the electrostatic energy filter uses only electric fields to manipulate the ion beam.

4. The apparatus of claim 3, wherein the electrostatic energy filter functions as a high pass filter, passing ions having an energy greater than a first predetermined value.

5. The apparatus of claim 3, wherein the electrostatic energy filter functions as a low pass filter, passing ions having an energy less than a second predetermined value.

6. The apparatus of claim 3, wherein the electrostatic energy filter functions as a band pass filter, passing ions having an energy between a first predetermined value and a second predetermined value.

7. The apparatus of claim 3, further comprising a second electrostatic energy filter disposed between the electrostatic energy filter and the workpiece.

8. An apparatus for extracting an ion beam, comprising:
an ion source having a plurality of chamber walls defining an ion source chamber, wherein one of the chamber walls comprises an extraction plate having an extraction aperture, wherein the extraction plate is biased using an RF voltage;
extraction optics, disposed outside the ion source chamber, to extract an ion beam from the ion source chamber through the extraction aperture; and
an electrostatic energy filter disposed downstream from the extraction optics, wherein the electrostatic energy filter comprises at least one electrode comprising an aperture therethrough, to selectively allow ions from the ion beam having a certain energy to pass through the aperture and to reach a workpiece.

9. The apparatus of claim 8, wherein the electrostatic energy filter comprises a first electrode biased at a first positive voltage, such that ions having an energy less than the first positive voltage are repelled by the first electrode, so that ions having an energy greater than the first positive voltage pass through the aperture.

10. The apparatus of claim 9, further comprising a second electrode biased at a negative voltage disposed between the first electrode and the workpiece to accelerate ions passing through the aperture of the first electrode.

11. The apparatus of claim 8, wherein the electrostatic energy filter comprises an entry electrode, an exit electrode and at least one central electrode, each electrode comprising an upper plate and a lower plate, defining an aperture therebetween, where the upper plate and lower plate are independently biased, and wherein apertures of the electrodes are not linearly aligned.

12. The apparatus of claim 11, wherein the electrostatic energy filter comprises a plurality of central electrodes.

13. The apparatus of claim 8, wherein the electrostatic energy filter comprises an entry electrode, an exit electrode and at least one central electrode, each electrode comprising two independently biased spaced apart conductive rods, defining an aperture therebetween, wherein apertures of each electrode are not linearly aligned.

14. The apparatus of claim 13, wherein the electrostatic energy filter comprises a plurality of central electrodes.

15. An apparatus for extracting an ion beam, comprising:
an ion source configured to extract an ion beam, wherein each species of ions in the ion beam has a unique ion energy distribution function; and
an electrostatic energy filter, disposed downstream from the ion source, to selectively pass certain species of ions toward a workpiece, based on the unique ion energy distribution function.

16. The apparatus of claim 15, wherein the electrostatic energy filter comprises a resolving aperture, such that only ions having a desired energy pass through the resolving aperture and are directed toward the workpiece.

17. The apparatus claim 15, further comprising a second electrostatic energy filter, disposed between the electrostatic energy filter and the workpiece, to selectively pass certain species of ions toward the workpiece, based on the unique ion energy distribution function.

* * * * *